US009711665B2

(12) United States Patent
Wagenblast et al.

(10) Patent No.: US 9,711,665 B2
(45) Date of Patent: Jul. 18, 2017

(54) COLOR CONVERTERS (75) Inventors: Gerhard Wagenblast, Wachenheim (DE); Martin Koenemann, Mannheim (DE); Sorin Ivanovici, Heidelberg (DE); Gerardus De Keyzer, Riehen (CH); Robert Send, Karlsruhe (DE)

(73) Assignee: BASF SE, Ludwigshafen (DE)

( * ) Notice: Subject to any disclaimer, the term of this patent is extended or adjusted under 35 U.S.C. 154(b) by 608 days.

(21) Appl. No.: 14/115,934

(22) PCT Filed: May 9, 2012

(86) PCT No.: PCT/EP2012/058503
§ 371 (c)(1),
(2), (4) Date: Nov. 6, 2013

(87) PCT Pub. No.: WO2012/152812
PCT Pub. Date: Nov. 15, 2012

(65) Prior Publication Data
US 2014/0076397 A1 Mar. 20, 2014

(30) Foreign Application Priority Data

May 10, 2011 (EP) .................................... 11003839
Feb. 23, 2012 (EP) .................................... 12156729

(51) Int. Cl.
*H01L 31/0232* (2014.01)
*C09K 11/06* (2006.01)
(Continued)

(52) U.S. Cl.
CPC ........ *H01L 31/02322* (2013.01); *C09K 11/06* (2013.01); *F21V 9/16* (2013.01);
(Continued)

(58) Field of Classification Search
CPC . H01L 31/048; H01L 31/055; H01L 31/0203; H01L 31/02322; H01L 33/502; H01L 33/56; C09K 11/06; F21V 9/16; G02B 5/20; Y10T 428/31721; Y10T 428/31678; Y10T 428/31935;
(Continued)

(56) References Cited

U.S. PATENT DOCUMENTS 5,920,080 A 7/1999 Jones
8,611,070 B2 12/2013 Ivanovici et al.
(Continued)

FOREIGN PATENT DOCUMENTS

DE 10 2008 057 720 5/2010
EP 1927141 6/2008
(Continued)

OTHER PUBLICATIONS

Lumogen F, pp. 1-6, BASF, Nov. 1997, obtained online from: http://www2.basf.us/additives/pdfs/p3201e.pdf.*
(Continued)

*Primary Examiner* — Alexander Kollias
(74) *Attorney, Agent, or Firm* — Oblon, McClelland, Maier & Neustadt, L.L.P.

(57) ABSTRACT

A color converter comprising at least one layer comprising at least one organic fluorescent colorant and at least one barrier layer having a low permeability to oxygen.

9 Claims, 2 Drawing Sheets (51) Int. Cl.
*H01L 31/048* (2014.01)
*H01L 31/055* (2014.01)
*F21V 9/16* (2006.01)
*G02B 5/20* (2006.01)
*H01L 31/0203* (2014.01)
*H01L 33/50* (2010.01)
*H01L 33/56* (2010.01)

(52) U.S. Cl.
CPC ............ *G02B 5/20* (2013.01); *H01L 31/0203* (2013.01); *H01L 31/048* (2013.01); *H01L 31/055* (2013.01); *H01L 33/502* (2013.01); *H01L 33/56* (2013.01); *Y02E 10/52* (2013.01); *Y10T 428/31504* (2015.04); *Y10T 428/31678* (2015.04); *Y10T 428/31721* (2015.04); *Y10T 428/31725* (2015.04); *Y10T 428/31855* (2015.04); *Y10T 428/31935* (2015.04)

(58) Field of Classification Search
CPC ..... Y10T 428/31725; Y10T 428/31855; Y10T 428/31504; Y02E 10/52
See application file for complete search history.

(56) References Cited

U.S. PATENT DOCUMENTS

| | | | |
|---|---|---|---|
| 2004/0137258 A1* | 7/2004 | Utsumi | C23C 14/205 428/629 |
| 2005/0029513 A1 | 2/2005 | Kawashima et al. | |
| 2006/0289884 A1* | 12/2006 | Soules | H05B 33/22 257/98 |
| 2007/0003743 A1 | 1/2007 | Asano et al. | |
| 2007/0059491 A1 | 3/2007 | Kawashima et al. | |
| 2007/0090755 A1 | 4/2007 | Eida et al. | |
| 2008/0001528 A1 | 1/2008 | Eida | |
| 2008/0245411 A1* | 10/2008 | Hammermann | C09B 5/62 136/256 |
| 2009/0142876 A1 | 6/2009 | Tuan et al. | |
| 2010/0060157 A1* | 3/2010 | Shi | H01L 33/507 313/512 |
| 2010/0230693 A1 | 9/2010 | Tran | |
| 2010/0291313 A1 | 11/2010 | Ling | |
| 2011/0143107 A1 | 6/2011 | Steinig-Nowakowski et al. | |
| 2011/0201190 A1 | 8/2011 | Hermes et al. | |
| 2011/0203649 A1 | 8/2011 | Könemann et al. | |
| 2011/0253988 A1 | 10/2011 | Molt et al. | |
| 2011/0266528 A1 | 11/2011 | Langer et al. | |
| 2011/0268647 A1 | 11/2011 | Ivanovici et al. | |
| 2011/0308592 A1 | 12/2011 | Könemann et al. | |
| 2011/0309343 A1 | 12/2011 | Langer et al. | |
| 2011/0309344 A1 | 12/2011 | Watanabe et al. | |
| 2011/0309346 A1 | 12/2011 | Watanabe et al. | |
| 2012/0007063 A1 | 1/2012 | Langer et al. | |
| 2012/0068123 A1 | 3/2012 | Sundarraj et al. | |
| 2012/0095222 A1 | 4/2012 | Schaefer et al. | |
| 2012/0138125 A1 | 6/2012 | Hammermann et al. | |
| 2012/0168731 A1 | 7/2012 | Schildknecht et al. | |
| 2012/0199823 A1 | 8/2012 | Molt et al. | |
| 2012/0205645 A1 | 8/2012 | Fuchs et al. | |
| 2012/0241681 A1 | 9/2012 | Schaefer et al. | |
| 2012/0299045 A1* | 11/2012 | Pan | H01L 51/5032 257/98 |
| 2013/0032766 A1 | 2/2013 | Molt et al. | |
| 2013/0065168 A1 | 3/2013 | De Keyzer et al. | |
| 2013/0078393 A1 | 3/2013 | De Keyzer et al. | |
| 2013/0092874 A1 | 4/2013 | Bacher et al. | |
| 2013/0164635 A1 | 6/2013 | Schmidt et al. | |
| 2013/0244862 A1 | 9/2013 | Ivanovici et al. | |
| 2013/0334546 A1 | 12/2013 | Wagenblast et al. | |
| 2015/0261076 A1* | 9/2015 | Dijken | H01L 33/507 359/326 |

FOREIGN PATENT DOCUMENTS

| | | | |
|---|---|---|---|
| JP | 8-222369 A | 8/1996 | |
| JP | 2005-206825 A | 8/2005 | |
| JP | 2006-525684 A | 11/2006 | |
| JP | 2007 207532 | 8/2007 | |
| JP | 2007 273498 | 10/2007 | |
| JP | 2008-10298 A | 1/2008 | |
| JP | 2009-140835 A | 6/2009 | |
| JP | 2011-63763 A | 3/2011 | |
| JP | 2011063763 A2 | 3/2011 | |
| RU | 2324106 C2 | 5/2008 | |
| RU | 2 416 841 C1 | 4/2011 | |
| TW | 200923024 A | 6/2009 | |
| WO | WO 03/104712 A2 | 12/2003 | |
| WO | 2007 006717 | 1/2007 | |
| WO | 2007 031446 | 3/2007 | |
| WO | WO 2010/136420 A1 | 12/2010 | |
| WO | WO 2010/145991 A1 | 12/2010 | |
| WO | WO 2011/001492 A1 | 1/2011 | |
| WO | WO 2011/045337 A1 | 4/2011 | |
| WO | WO 2011/051404 A1 | 5/2011 | |
| WO | WO 2011/073149 A1 | 6/2011 | |
| WO | WO 2011/082961 A2 | 7/2011 | |
| WO | WO 2011/101777 A1 | 8/2011 | |
| WO | WO 2011/101810 A1 | 8/2011 | |
| WO | WO 2011091946 * | 8/2011 ............ H01L 27/32 |
| WO | WO 2011/125020 A1 | 10/2011 | |
| WO | WO 2011/131722 A1 | 10/2011 | |
| WO | WO 2011/138176 A1 | 11/2011 | |
| WO | WO 2011/138287 A1 | 11/2011 | |
| WO | WO 2011/141486 A1 | 11/2011 | |
| WO | WO 2011/147924 A1 | 12/2011 | |
| WO | WO 2011/157614 A1 | 12/2011 | |
| WO | WO 2011/157779 A1 | 12/2011 | |
| WO | WO 2011/157790 A1 | 12/2011 | |
| WO | WO 2011/158204 A1 | 12/2011 | |
| WO | WO 2011/158211 A1 | 12/2011 | |
| WO | WO 2012/004765 A2 | 1/2012 | |
| WO | WO 2012/020327 A1 | 2/2012 | |
| WO | WO 2012/045710 A1 | 4/2012 | |
| WO | WO 2012/070013 A1 | 5/2012 | |
| WO | 2012 113884 | 8/2012 | |
| WO | WO 2012/130709 A1 | 10/2012 | |

OTHER PUBLICATIONS

STN Search Report, pp. 1-4, May 9, 2016.*
What Wavelength Goes With a Color, NASA, pp. 1-4, no publication date given, obtained online from: http://science-edu.larc.nasa.gov/EDDOCS/Wavelengths_for_Colors.html.*
Tsai et al, Improving the Lumen Efficiency by Air-Gap Embedded Package in White Light-Emitting Diodes, ACOFT Presentation, Aug. 28-Sep. 1, 2011, Syndey Australia, pp. 1538-1540.*
STN Search Report II, pp. 1-6, Nov. 2016.*
Dictionary.com—Layer, pp. 1-13, no publication date given, obtained online from: http://www.dictionary.com/browse/layer.*
Merriam-Webster—Layer, pp. -10, no publication date given, obtained from: http://www.merriam-webster.com/dictionary/layer.*
Englsih Oxford Dictionary, pp. 1-3, no publication date given, obtained on line from https://en.oxforddictionaries.com/definition/layer.*
The Free Dictionary—Embedded, pp. 1-2, no publication date given, obtained online from: http://www.thefreedictionary.com/embedded.*
U.S. Appl. No. 14/758,349, filed Jun. 29, 2015, Wonneberger, et al.
International Search Report Issued Jun. 28, 2012 in PCT/EP12/058503 Filed May 9, 2012.
U.S. Appl. No. 14/123,530, filed Dec. 3, 2013, Koenemann, et al.
Guangyan Hong, *Rare Earth Luminescent Materials: Basics and Applications*, Section 14.3.9, "Post-Treatment and Surface Coating", Apr. 30, 2011, pp. 532-538 (w/partial English translation).
Notice of Allowance issued Nov. 10, 2016 in Russian Patent Application No. 2013154471/05(085050).

* cited by examiner

COLOR CONVERTERS

CROSS REFERENCE TO RELATED APPLICATION

This application is a National Stage entry under 35 USC 371 of PCT/EP12/058503, filed on May 9, 2012, and claims priority to European Patent Application No. 11003839.5, filed May 10, 2011, and to European Patent Application No. 12156729.1, filed Feb. 23, 2012.

The present invention has for its subject matter color converters comprising at least one layer comprising at least one organic fluorescent colorant and at least one barrier layer having a low permeability to oxygen.

The invention further provides illumination devices comprising at least one LED and at least one color converter comprising at least one layer comprising at least one organic fluorescent colorant and at least one barrier layer having a low permeability to oxygen.

The invention further provides solar cells comprising a color converter comprising at least one layer comprising at least one organic fluorescent colorant and at least one barrier layer having a low permeability to oxygen.

Color converters are devices which are capable of absorbing light of particular wavelengths and converting it to light of other wavelengths.

Color converters play a role in various industrial applications, such as in illumination devices comprising light-emitting diodes (LEDs) or in solar cells based on organic fluorescent dyes.

Light-emitting diodes (LEDs) are playing an increasingly important role in illumination technology since they have a comparatively long lifetime and a very good energy efficiency. The emission of light therefrom is based on the recombination of electron-hole pairs (excitons) in the junction area of a forward-biased semiconductor pn junction. The size of the band gap of this semiconductor determines the approximate wavelength. LEDs can be produced in various colors.

Stable and energy-efficient blue LEDs can produce white light by color conversion. According to a known method for this purpose, a polymeric material comprising a fluorescent colorant is applied directly to the LED light source (LED chip).

Frequently, the polymeric material is supplied to the LED chip in approximately droplet or hemispherical form, as a result of which particular optical effects contribute to the emission of light. Such structures in which fluorescent colorants in a polymeric matrix are applied directly and without intervening space to an LED chip are also referred to as "phosphor on a chip". In phosphor on a chip LEDs, the fluorescent colorants used to date have generally been inorganic materials. The fluorescent colorants, which may consist, for example, of cerium-doped yttrium aluminum garnet, absorb a certain proportion of blue light and emit longer-wave light with a broad emission band, such that the mixing of the blue light transmitted and of the light emitted gives rise to white light.

In order to improve the color reproduction of such illumination elements, it is additionally possible to incorporate a red-emitting diode as well as the white light diode described. This can produce light which many people perceive to be more pleasant. However, this is more technically complicated and more costly.

In phosphor on a chip LEDs, the polymeric material and the fluorescent colorant are subject to relatively high thermal and radiative stress. For this reason, organic fluorescent colorants have to date not been suitable for use in phosphor on a chip LEDs. Organic fluorescent dyes can in principle generate good color reproduction through their broad emission bands. However, they have to date not been stable enough to cope with the stresses in the case of direct arrangement on the LED chip. There is no clarity to date as to the decomposition mechanism of the organic fluorescent dyes and as of the direct cause for the inadequate stability thereof.

In order to produce white light by color conversion from blue light, there is a further concept in which the color converter (also referred to simply as "converter"), which generally comprises a carrier and a polymer layer, is at a certain distance from the LED chip. Such a structure is referred to as "remote phosphor".

The spatial distance between the primary light source, the LED, and the color converter reduces the stress resulting from heat and radiation to such an extent that the requirements on the stability can be achieved by suitable organic fluorescent dyes. Furthermore, LEDs according to the "remote phosphor" concept are even more energy-efficient than those according to the "phosphor on a chip" concept.

The use of organic fluorescent dyes in these color converters offers various advantages. Firstly, organic fluorescent dyes are much higher-yielding due to their significantly higher mass-specific absorption, which means that considerably less material is required for efficient radiation conversion than in the case of inorganic radiation converters. Secondly, they enable good color reproduction and are capable of producing pleasant light. Furthermore, they do not require any materials comprising rare earths, which have to be mined and provided in a costly and inconvenient manner and are available only to a limited degree.

It is therefore desirable to provide color converters which comprise organic fluorescent dyes and have a long lifetime.

DE 10 2008 057 720 A1 describes the concept of remote phosphor LEDs and discloses, as well as a conversion layer comprising inorganic radiation conversion luminophores, the use of organic radiation conversion luminophores embedded into a polymeric matrix. The polymeric matrices mentioned are, for example, silicones, epoxides, acrylates or polycarbonates.

US 2010/0230693 A1 describes illumination devices in which fluorescent colorants are encapsulated in a lenticular shape by silicone materials. However, the use of organic fluorescent colorants is not disclosed.

US 2010/0291313 A1 describes illumination devices in which LED inorganic fluorescent colorants are present in a remote phosphor arrangement.

JP 2007/273498 describes color converters in which fluorescent colorants are dispersed in a resin and sealed with a film having an oxygen permeability of less than 10 mL/m$^2$*d and a water vapor permeability of less than 1 mL/m$^2$*d. The use of organic fluorescent colorants is not disclosed.

JP 2007/207532 describes illumination devices comprising a color converter in which fluorescent colorants are dispersed in a resin and sealed with polymer having low oxygen permeability. The use of organic fluorescent colorants is not disclosed.

EP 1927141 discloses fluorescence conversion solar cells comprising terrylene fluorescent dyes.

It was an object of the present invention to provide color converters based on organic fluorescent colorants which do not have the disadvantages of the prior art and which especially have a long lifetime.

In addition, illumination devices and solar cells comprising such color converters were to be provided.

The object is achieved by the color converters, illumination devices and solar cells specified at the outset.

Inventive color converters comprise at least one organic fluorescent colorant embedded in a polymeric matrix.

Fluorescent colorants include all materials which are capable of absorbing light of a particular wavelength and converting it to light of another wavelength.

Such materials are also referred to as phosphors or radiation conversion luminophores.

According to the selection of the fluorescent colorants and of the wavelength absorbed, it is possible that inventive color converters emit light in a great variety of colors. In many cases, however, the aim is to obtain white light.

Organic fluorescent colorants may be organic fluorescent pigments or organic fluorescent dyes.

Suitable organic fluorescent colorants are in principle all organic dyes or pigments which can absorb light of a particular wavelength and convert it to light of other wavelengths, which can be dissolved or distributed homogeneously in a polymeric matrix and which have a sufficient stability to thermal and radiative stress.

Typically, suitable organic pigments have a mean particle size to DIN 13320 of 0.01 to 10 μm, preferably 0.1 to 1 μm.

Suitable organic fluorescent dyes fluoresce in the visible region of the spectrum and are, for example, the green-, orange- or red-fluorescing fluorescent dyes listed in the Color Index. Further suitable organic fluorescent dyes fluoresce in the visible region of the spectrum and are, for example, the yellow- or greenish-yellow-fluorescing fluorescent dyes listed in the Color Index. The terms "greenish-yellow-fluorescing" and "yellowish-green-fluorescing" will be used synonymously here and hereinbelow.

Preferred organic fluorescent dyes are functionalized naphthalene or rylene derivatives.

Preferred naphthalene derivatives are green-, orange- or red-fluorescing fluorescent dyes comprising a naphthalene unit. Further preferred naphthalene derivatives are yellow- or greenish-yellow-fluorescent dyes comprising a naphthalene unit.

Preference is additionally given to naphthalene derivatives bearing one or more substituents selected from halogen, cyano, benzimidazole, or radicals bearing one or more carbonyl functions. Suitable carbonyl functions are, for example, carboxylic esters, dicarboximides, carboxylic acids, carboxamides.

Preferred rylene derivatives comprise a perylene unit. A preferred embodiment involves green-, orange- or red-fluorescing perylenes.

Preference is given to perylene derivatives which bear one or more substituents selected from halogen, cyano, benzimidazole, or radicals bearing one or more carbonyl functions. Suitable carbonyl functions are, for example, carboxylic esters, carboximides, carboxylic acids, carboxamides.

Preferred perylene derivatives are, for example, the perylene derivatives specified in WO 2007/006717 at page 1 line 5 to page 22 line 6.

In a particularly preferred embodiment, suitable organic fluorescent dyes are perylene derivatives selected from the formulae II to VI

II

III

IV where R¹ is a linear or branched $C_1$-$C_{18}$ alkyl radical, a $C_4$-$C_8$ cycloalkyl radical which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl.

In one embodiment, R¹ in the formulae II to VI represents compounds with what is called swallowtail substitution, as specified in WO 2009/037283 A1 at page 16 line 19 to page 25 line 8. In a preferred embodiment, R¹ is a 1-alkylalkyl, for example 1-ethylpropyl, 1-propylbutyl, 1-butylpentyl, 1-pentylhexyl or 1-hexylheptyl.

In the formulae II to VI, X represents substituents in the ortho and/or para position. X is preferably linear or branched $C_1$ to $C_{18}$ alkyl.

"y" indicates the number of substituents X. "y" is a number from 0 to 3, e.g. 0, 1, 2 or 3.

More preferably, R¹ in the formulae II to VI is 2,4-di(tert-butyl)phenyl or 2,6-disubstituted phenyl, especially preferably 2,6-diphenylphenyl, 2,6-diisopropylphenyl.

Especially preferably, X is tert-butyl in the ortho/para position and/or secondary alkyl, especially isopropyl, in the ortho positions, or phenyl in the ortho positions.

In a preferred aspect of this embodiment, suitable organic fluorescent dyes are selected from N,N'-bis(2,6-diisopropylphenyl)-1,7-di(2,6-diisopropylphenoxy)perylene-3,4:9,10-tetracarboximide, N,N'-bis(2,6-diisopropylphenyl)-1,6-di(2,6-diisopropylphenoxy)perylene-3,4:9,10-tetracarboximide, and mixtures thereof. In a further aspect of this embodiment, the organic fluorescent dye is 9-cyano-N-(2,6-di(isopropyl)phenyl)perylene-3,4-dicarboxylic monoimide.

A further suitable organic fluorescent dye in this embodiment is a dye of the formula VI, for example N,N'-bis(2,6-diisopropylphenyl)-1,6,7,12-tetraphenoxyperylene-3,4:9,10-tetracarboximide (Lumogen® Red 300).

In a further particularly preferred embodiment, suitable organic fluorescent dyes are perylene derivatives selected from the formulae VII to X, -continued

X where $R^1$ in the formulae VII to X is a linear or branched $C_1$-$C_{18}$ alkyl radical, a $C_4$-$C_8$ cycloalkyl radical, which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl.

In one embodiment, $R^1$ in the formulae VII to X represents compounds with what is called swallowtail substitution, as specified in WO 2009/037283 A1 at page 16 line 19 to page 25 line 8. In a preferred embodiment, $R^1$ is a 1-alkylalkyl, for example 1-ethylpropyl, 1-propylbutyl, 1-butylpentyl, 1-pentylhexyl or 1-hexylheptyl.

Especially preferably, $R^1$ in the formulae VII to X is linear or branched $C_1$ to $C_6$ alkyl, especially n-butyl, sec-butyl, 2-ethylhexyl. $R^1$ is preferably also isobutyl.

In a specific aspect of this embodiment, the suitable organic fluorescent dye is selected from 3,9-dicyanoperylene-4,10-bis(isobutyl carboxylate), 3,10-dicyanoperylene-4,9-bis(isobutyl carboxylate) and mixtures thereof. In a further aspect of this embodiment, the organic fluorescent dye is also selected from 3,9-dicyanoperylene-4,10-bis(sec-butylcarboxylate), 3,10-dicyanoperylene-4,9-bis(sec-butylcarboxylate) and mixtures thereof.

Further preferred fluorescent dyes are Disperse Yellow 199, Solvent Yellow 98, Disperse Yellow 13, Disperse Yellow 11, Disperse Yellow 239, Solvent Yellow 159.

In a preferred embodiment, the color converter comprises at least one organic fluorescent dye selected from N,N'-bis(2,6-diisopropylphenyl)-1,7-di(2,6-diisopropylphenoxy)perylene-3,4:9,10-tetracarboximide, N,N'-bis(2,6-diisopropylphenyl)-1,6-di(2,6-diisopropylphenoxy)perylene-3,4:9,10-tetracarboximide, 3,9-dicyanoperylene-4,10-bis(isobutyl carboxylate), 3,10-dicyanoperylene-4,9-bis(isobutyl carboxylate), 3,9-dicyanoperylene-4,10-bis(sec-butylcarboxylate), 3,10-dicyanoperylene-4,9-bis(sec-butylcarboxylate), 9-cyano-N-(2,6-di(isopropyl)phenyl)perylene-3,4-dicarboxylic monoimide, N,N'-bis(2,6-diisopropylphenyl)-1,6,7,12-tetraphenoxyperylene-3,4:9,10-tetracarboximide and mixtures thereof. In a specific embodiment, the converter comprises a mixture of 3,9-dicyanoperylene-4,10-bis(isobutyl carboxylate), 3,10-dicyanoperylene-4,9-bis(isobutyl carboxylate) and N,N'-bis(2,6-diisopropylphenyl)-1,6,7,12-tetraphenoxyperylene-3,4:9,10-tetracarboximide.

In a preferred embodiment, color converters comprise at least two different organic fluorescent dyes. For example, a green-fluorescing fluorescent dye can be combined with a red-fluorescing fluorescent dye. Green-fluorescing fluorescent dyes are especially understood to mean those yellow dyes which absorb blue light and emit green or yellowish-green fluorescent light. Suitable red dyes either directly absorb the blue light of the LED or absorb the green light emitted by the other dyes present and emit red fluorescent light.

In a last preferred embodiment, inventive color converters comprise only a single organic fluorescent dye, for example an orange fluorescent dye.

According to the invention, the organic fluorescent colorants are embedded into a matrix of an organic polymer.

If the organic fluorescent colorants are pigments, they are generally dispersed in the matrix.

Organic fluorescent dyes may either be dissolved in the organic polymer or be in the form of a homogeneously distributed mixture. The organic fluorescent dyes are preferably dissolved in the organic polymer.

Suitable matrix materials are all polymers in which the fluorescent colorants can be dissolved or distributed homogeneously.

Suitable matrix materials are, for example, polystyrene, polycarbonate, polymethyl methacrylate, polyvinylpyrrolidone, polymethacrylate, polyacrylate, polyvinyl acetate, polyvinyl chloride, polybutene, polyethylene glycol or epoxy resins. Further suitable matrix materials are polyester such as polybutylene terephthalate (PBT), polybutylene naphthalate (PBN), polyethylene terephthalate (PET) or polyethylene naphthalate (PEN).

In one embodiment, the matrix materials are organic polymers which consist essentially of polystyrene and/or or polycarbonate. Suitable polystyrenes or polycarbonates include those polymers as disclosed in the application with reference number EP 11155901.9 (now PCT/EP2012/053102) which was yet to be published at the priority date of the present application.

Suitable matrix materials may comprise, as further constituents, additives, such as flame retardants, antioxidants, light stabilizers, free-radical scavengers, antistats. Such stabilizers are known to those skilled in the art.

In a preferred embodiment of the invention, suitable polystyrenes or polycarbonates do not comprise any antioxidants or free-radical scavengers.

In one embodiment of the invention, the at least one matrix material comprises transparent polymers.

In another embodiment, the at least one matrix material comprises opaque polymers.

In one embodiment, suitable matrix materials have been mechanically reinforced with glass fibers.

For the execution of the invention, the geometric arrangement in which the matrix comprising organic fluorescent colorants is present is not crucial. The matrix comprising organic fluorescent colorants may, for example, be in the form of films, sheets or plates.

It is likewise possible for the matrix comprising organic fluorescent colorants to be present in droplet or hemispherical form, or in the form of lenses with convex and/or concave, flat or spherical surfaces.

When inventive color converters comprise more than one fluorescent colorant, it is possible in one embodiment of the invention for several fluorescent colorants to be present alongside one another in one layer.

In another embodiment, the different fluorescent colorants are present in different layers.

In one embodiment of the invention, the polymer layers (matrices) comprising organic fluorescent dye are 25 to 200 micrometres in thickness, preferably 35 to 150 μm and more preferably 50 to 100 μm.

In another embodiment, the polymer layers comprising organic fluorescent dye are 0.2 to 5 millimetres in thickness, preferably 0.3 to 3 mm, more preferably 0.4 to 2 mm, e.g. 0.4 to 1 mm.

In a preferred embodiment, the layers of the inventive color converters are continuous and do not have any holes or interruptions, such that light emitted by the LED must in any case pass through a matrix or layer comprising organic fluorescent colorant.

The concentration of the organic fluorescent dyes in the matrix material depends on factors including the thickness of the polymer layer. If a thin polymer layer is used, the concentration of the organic fluorescent dye is generally higher than in the case of a thick polymer layer.

Typically, the total concentration of the organic fluorescent dyes is 0.0002 to 0.5% by weight, e.g. 0.001 to 0.5% by weight, or 0.002 to 0.1% by weight, more preferably 0.0005 to 0.1% by weight, in particular 0.001 to 0.05% by weight, e.g. 0.005 to 0.05% by weight, based in each case on the amount of the polymer.

Organic pigments are generally used in a concentration of 0.001 to 0.5% by weight, preferably 0.002 to 0.2% by weight, more preferably 0.005 to 0.2% by weight, even more preferably 0.005 to 0.1% by weight, e.g. 0.01 to 0.1% by weight, based in each case on the amount of the polymer.

In a preferred embodiment, at least one of the layers or matrices comprising organic fluorescent dye comprises scattering bodies for light.

In a further preferred embodiment of the multilayer structure, several layers comprising fluorescent dyes and one or more layers comprising scatterers without fluorescent dye are present.

Suitable scattering bodies are inorganic white pigments, for example titanium dioxide, barium sulfate, lithopone, zinc oxide, zinc sulfide, calcium carbonate with a mean particle size to DIN 13320 of 0.01 to 10 μm, preferably 0.1 to 1 μm, more preferably 0.15 to 0.4 μm.

Scattering bodies are included typically in an amount of 0.01 to 2.0% by weight, preferably 0.05 to 0.5% by weight, more preferably 0.1 to 0.4% by weight, based in each case on the polymer of the layer comprising scattering bodies.

Inventive color converters further comprise at least one barrier layer.

A barrier layer is understood to mean a layer having a low permeability to oxygen. Suitable barrier layers may themselves have a multilayer structure. The multilayer structure can be a two-layer structure, three-layer structure, four-layer structure, five-layer structure or more than five-layer structure.

Suitable barrier layers generally have permeability to oxygen of less than 100 mL/m$^2$*d, preferably less than 1 mL/m$^2$*d, more preferably less than 0.1 mL/m$^2$*d, even more preferably less than 0.01 mL/m$^2$*d and especially preferably less than 0.001 mL/m$^2$*d.

The permeability of the barrier layer is determined by the thickness of the layer and the specific oxygen permeability of the barrier material.

Barrier layers preferably consist essentially of at least one barrier material with a low specific oxygen permeability.

Suitable barrier materials generally have a specific permeability to oxygen of less than 1000 mL*100 μm/m$^2$*d, preferably less than 1 mL/m$^2$*d, more preferably less than 0.1 mL/m$^2$.

The at least one barrier layer consists essentially of at least one barrier material selected from glass, metal oxides different from glass and at least one polymer.

Particularly preferred barrier materials are glass, quartz, metal oxides, $SiO_2$, titanium nitride, $SiO_2$/metal oxide multilayer materials, polyvinyl alcohol, polyacrylonitrile, polyvinylidene chloride (PVDC), liquid-crystal polymers (LCP), polystyrene-acrylonitrile (SAN), polybutylene terephthalate (PBT), polyethylene terephthalate (PET), polybutylene naphthalate (PBN), polyethylene naphthalate (PEN), polyvinyl butyrate (PVB), polyvinyl chloride (PVC), polyamides, polyimides, polyetherimides, polyoxymethylenes, epoxy resins or mixtures thereof. Further preferred barrier materials are polybutylene naphthalate (PBN), polyethylene naphthalate (PEN) and polymers derived from ethylene vinyl acetate (EVA) and from ethylene vinyl alcohol (EVOH). Further preferred barrier materials are inorganic-organic hybrid polymers, such as ormocers© brands, trademark of the Fraunhofer-Gesellschaft zur Förderung der angewandten Forschung e.V. Munich, Germany.

Further preferred barrier materials are by physical vapor processes (PVD) produced tantalum-based barrier layers, by chemical vapor processes (CVD) produced SiOx barrier layers and SiOx:Na barrier layers deposited by the sol/gel method.

Glass is understood in this context to mean, for example, materials as described, for example, in Hollemann-Wiberg, Lehrbuch der anorganischen Chemie [Inorganic Chemistry], 91st-100th edition, 1985, p. 779-783.

Suitable metal oxides are, for example, colorless metal oxides. These are preferably aluminum oxide, zirconium oxide, zinc oxide or barium oxide. Further preferred metal oxides are magnesium oxide, hafnium oxide or tantal oxide. $SiO_2$ and metal oxides are generally applied by PVD processes or sputtering.

$SiO_2$/metal oxide multilayer systems in this context include systems which have more than one coating each of silicon dioxide and metal oxide one on top of another. Suitable metal oxides are, for example, aluminum oxide. Suitable $SiO_2$/metal oxide multilayer systems typically comprise more than 2 of each, preferably more than 10 of each, of coatings of $SiO_2$ and metal oxide.

Tantalum-based barrier layers (e.g. TaSiO) can be deposited by PVD processes with the aid of cathode atomization ("sputtering"). This is a process for physical deposition from the gas phase (PVD), in which material is removed from the target by ion bombardment and is deposited on the substrate as a layer. The layers thus prepared are a few hundred nanometers in thickness.

SiOx barrier layers can be produced by CVD processes be deposited with the aid of microwave plasma-promoted chemical deposition from the gas phase (MWPECVD). For this purpose, an organic precursor substance (hexamethyldisiloxane) is decomposed under the action of plasma and converted chemically to $SiO_x$ on the substrate with other reactants (e.g. oxygen). The layers deposited are a few micrometers in thickness.

SiOx:Na barrier layers can be deposited by the sol-gel method in a dip-coating process. This is a method of wet-chemical deposition from the liquid phase. This involves catalytic hydrolysis of an organosilane sol and subsequent thermal conversion to SiOx on the substrate. The layers used here too are a few micrometers in thickness.

Glass is especially preferred.

When barrier materials with a low specific oxygen permeability are used, the thickness of the barrier layer may be lower than in the case of barrier materials with a relatively higher specific oxygen permeability.

In general, barrier layers have a thickness of 0.01 µm to 5 mm, preferably 0.1 µm to 1000 µm and more preferably 1 µm to 100 µm.

Barrier layers of glass preferably have a thickness of 0.01 to 5000 µm and more preferably of 0.1 to 1000 µm.

Barrier layers of organic polymers generally have a thickness of 0.01 to 1000 µm and preferably 0.1 to 200 µm, in particular 60 to 150 µm, e.g. 0.1 to 100 µm.

In a preferred embodiment of the invention, barrier layers, in addition to a low permeability to oxygen, have a low permeability to water vapour. Typically, the permeability of the at least one barrier layer to water vapour is less than 10 $g/m^2*d$, preferably less than 1 $g/m^2*d$, more preferably less than 0.1 $g/m^2*d$, even more preferably less than 0.01 $g/m^2*d$ and especially preferably less than 0.001 $g/m^2*d$.

Barrier layers are generally of homogeneous thickness. However, it is possible that the barrier layers in different regions of the barrier layer have different thicknesses. For example, through specific geometric shapes of the barrier layers, optical effects such as lens effects can be utilized.

In general, barrier layers have the geometric shape of the layer of the color converter with which they are in contact. However, this is not absolutely necessary, provided that it is ensured that the barrier layer prevents the ingress of oxygen to the layers comprising fluorescent colorants.

Inventive color converters have at least one barrier layer on the top side of the color converter. In LED-comprising illumination devices, the top side of the color converter faces away from the LED and the bottom side of the color converter faces the LED. In solar cells, the top side faces the sun. It is essential to the invention that the ingress of oxygen from the atmosphere to the layer comprising fluorescent dye is prevented.

When inventive color converters do not comprise a barrier layer on the bottom side of the color converter, a medium preferably present on the bottom side of the color converter has an oxygen content of less than 5% by weight, preferably less than 1% by weight, more preferably less than 0.1% by weight. The medium may, for example, comprise gases such as nitrogen, helium, neon, argon, krypton, xenon, carbon dioxide, sulfur hexafluoride, hydrocarbon, or other substances which do not have oxidizing action with respect to the fluorescent colorant.

If there is no barrier layer on the bottom side of the color converter, the diffusion or transport of gases from the atmosphere to the bottom side of the converter, in a preferred embodiment, is prevented by the oxygen-tight sealing of the space on the bottom side of the color converter.

In a preferred embodiment of the invention, inventive color converters have at least one barrier layer both on the top and bottom side. The layer comprising at least one fluorescent colorant is then enveloped in a sandwich-like manner by barrier layers.

In a further preferred embodiment, the layer comprising at least one organic fluorescent colorant is surrounded on all sides by at least one barrier layer.

It is likewise possible that color converters have several barrier layers on the same side of the converter.

When inventive color converters comprise more than just one barrier layer, these may consist of the same or different barrier materials. It is likewise possible that one barrier layer comprises several barrier materials. It is likewise possible that one barrier layer itself has a multilayer structure. The multilayer structure comprises at least one oxygen barrier layer and a further layer. Further layer(s) can act as barrier for water vapour. In addition, further layers may allow heatsealing of the top and bottom barrier layers. According to one aspect of the invention, the further layer is an organic polymer, preferably a thermoplastic resin such as a polyolefin, e.g. polyethylene (PE) or polypropylene (PP). According to a further aspect, the oxygen barrier layer is embedded within at least two layers. Preferably, the oxygen barrier layer is embedded within at least two layers of organic polymers. According to a specific aspect, the barrier layer has a multilayer structure with outer layers made of a thermoplastic resin and at least one intermediate layer having a low permeability to oxygen. Examples of suitable multilayer barrier films are: ESCAL™ films, composed of PP/metal oxide coated PVA (polyvinyl alcohol)/PE, supplier Dry& Safe, Oensingen, Switzerland; Saranex™ films (available from Dow, USA), which are multilayer blown coextruded films with polyolefin skin layers and a PVDC (polyvinylidene chloride) barrier layer; and, EVAL™ EVOH (ethylene vinyl alcohol) copolymer resins supplier EVAL Europe nv, Antwerpen, Netherlands.

Inventive color converters may optionally comprise further constituents, such as a carrier layer.

Carrier layers serve to impart mechanical stability to the color converter. The type of material of the carrier layers is not crucial, provided that it is transparent and has the desired mechanical strength. Suitable materials for carrier layers are, for example, glass or transparent rigid organic polymer, such as polycarbonate, polystyrene or polymethacrylates or polymethyl methacrylates.

Carrier layers generally have a thickness of 0.1 mm to 10 mm, preferably 0.3 mm to 5 mm, more preferably 0.5 mm to 2 mm.

Compared to those according to the prior art, inventive color converters exhibit a long lifetime and a high quantum yield, and emit pleasant light with good color reproduction.

Inventive color converters are suitable, for example, for the conversion of light produced by LEDs. The invention therefore further provides illumination devices comprising at least one LED and at least one inventive color converter.

The LEDs of technical relevance are frequently blue LEDs which emit light with a peak wavelength of, for example, 420 to 480 nm, more preferably 440 to 470 nm, most preferably 445 to 460 nm.

Inventive color converters can be used in illumination devices in combination with LEDs in virtually any geometric shape and irrespective of the structure of the illumination device.

Preferably, inventive color converters are used in a remote phosphor structure. In this case, the color converter is spatially separated from the LED. In general, the distance between LED and color converter is from 0.1 cm to 50 cm, preferably 0.2 to 10 cm and most preferably 0.5 to 3, e.g. 0.5 to 2 cm. Between color converter and LED may be different media, such as air, noble gases, nitrogen or other gases, or mixtures thereof.

The color converter may, for example, be arranged concentrically around the LED or as a flat layer, plate or sheet.

Inventive illumination devices are suitable, for example, for illumination indoors, outdoors, of offices, of vehicles, in torches, games consoles, street lights, illuminated traffic signs.

The invention further provides fluorescence conversion solar cells comprising inventive color converters.

EXAMPLES

Materials Used

Polymer 1: transparent homopolymer of methyl methacrylate having a Vicat softening temperature of 96° C. to DIN EN ISO 306, (Plexiglas® 6N from Evonik)

Polymer 2: transparent polystyrene based on a homopolymer of styrene having a density of 1048 kg/m$^3$ and a Vicat softening temperature of 98° C. to DIN EN ISO 306 (PS 168 N from BASF SE)

Dye 1: greenish-yellow-fluorescing fluorescent dye consisting of a mixture of 3,9-dicyanoperylene-4,10-bis(isobutyl carboxylate) and 3,10-dicyanoperylene-4,9-bis(isobutyl carboxylate).

Dye 2: yellow-fluorescing fluorescent dye with the name 9-Cyano-N-(2,6-diisopropylphenyl)perylene-3,4-dicarboxylic monoimide.

Dye 3: red-fluorescing fluorescent dye with the name N,N'-bis(2,6-diisopropylphenyl)-1,6,7,12-tetraphenoxyperylene-3,4:9,10-tetracarboximide.

Barrier material 1: plates of borosilicate glass of thickness 1 mm with an area of 3 cm×3 cm.

Barrier material 2: barrier film ESCAL™ (composed of polypropylene (PP)/metal oxide coated PVA (polyvinyl alcohol)/polyethylene (PE), film thickness: approx. 112 μm), supplier Dry&Safe GmbH, Oensingen, Switzerland.

Barrier material 3: barrier film Saranex™ (available from Dow, USA), which are multilayer blown coextruded films with polyolefin skin layers and a PVDC (polyvinylidene chloride) barrier layer; film thickness 102 μm.

Barrier material 4: EVAL™ L films, ethylene vinyl alcohol (EVOH) copolymer films, supplier EVAL Europe nv, Antwerpen, Netherlands.

Titanium dioxide: TiO$_2$ rutile pigment by the sulfate process with a mean scattering power to DIN 53165 of 94.0 to 100 (Kronos® 2056 from Kronos Titan)

Exposure of the Samples:

The samples were exposed with a self-constructed exposure apparatus composed of 16 commercially available GaN-LEDs of the Rebel™ series (from Lumileds Lighting, wavelength approx. 451 nm). Two light-scattering plates of opal glass were arranged in front of the exposure apparatus. The luminance at each sample position was homogenously distributed and approx. 0.08 W/cm$^2$.

Determination of the Photostability of the Samples:

For analysis, the samples were removed from the exposure stations and analyzed in the C9920-02 quantum yield measuring system (from Hamamatsu). This involved illuminating each of the samples in an integrating sphere (Ulbricht sphere) with light of 450 to 455 nm. By comparison with the reference measurement in the Ulbricht sphere without sample, the non-absorbed fraction of the excitation light and the fluorescent light emitted by the sample are determined by means of a calibrated CCD spectrometer. Integration of the intensities over the non-absorbed excitation light or over the emitted fluorescent light gives the degree of absorption or fluorescence intensity or fluorescence quantum yield of each sample.

Each of the specimens was exposed constantly over a period of 20 days and removed from the exposure apparatus only to determine the degree of absorption, the fluorescence intensity and the fluorescence quantum yield of the color converters.

Production of the Color Converters 1-4:

Approx. 2.5 g of polymer and the desired amount of dye were dissolved in approx. 5 mL of methylene chloride, and 0.5% by weight of TiO$_2$, based on the amount of polymer used was dispersed therein. The resulting solution/dispersion was coated onto a glass surface with a box-type coating bar (wet film thickness 400 μm). After the solvent had dried off, the film was detached from the glass and dried at 50° C. in a vacuum drying cabinet overnight. Two circular film pieces each with a diameter of 22 mm were punched out of this film, and then served as test samples.

Encapsulation with Glass:

The thus obtained film pieces were transferred with the barrier material 1 into a nitrogen-filled glovebox. After about 2 hours, the film pieces were placed between two sheets of barrier material 1 and pressed on using fingers. Subsequently, the thus obtained test samples enclosed in a sandwich-like manner were sealed at the edges of the glass plates with a photocurable epoxy adhesive, and removed again from the glovebox.

The following samples were produced and examined:

| No. | Polymer | Dye | Dye content* | TiO$_2$ content* | Film thickness | Barrier layers |
|---|---|---|---|---|---|---|
| 1 | 1 | 1 | 0.014% by wt. | 0.5% by wt. | 84 μm | top and bottom |
| 1a | 1 | 1 | 0.02% by wt. | 0.5% by wt. | 96 μm | none |
| 2 | 2 | 1 | 0.014% by wt. | 0.5% by wt. | 82 μm | top and bottom |
| 2a | 2 | 1 | 0.014% by wt. | 0.5% by wt. | 82 μm | none |
| 3a | 2 | 1 | 0.03% by wt. | 0.5% by wt. | 79 μm | none |
| 4 | 1 | 2 | 0.02% by wt. | 0.5% by wt. | 91 μm | top and bottom |
| 4a | 1 | 2 | 0.02% by wt. | 0.5% by wt. | 91 μm | none |
| 5 | 2 | 2 | 0.03% by wt. | 0.5% by wt. | 73 μm | top and bottom |
| 5a | 2 | 2 | 0.03% by wt. | 0.5% by wt. | 73 μm | none |

*based on the amount of polymer used

Figure 1:
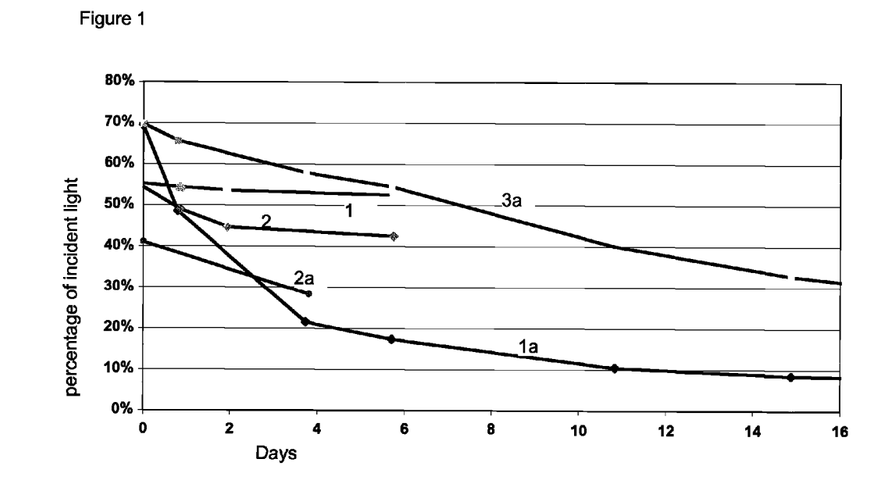
Figure 3:
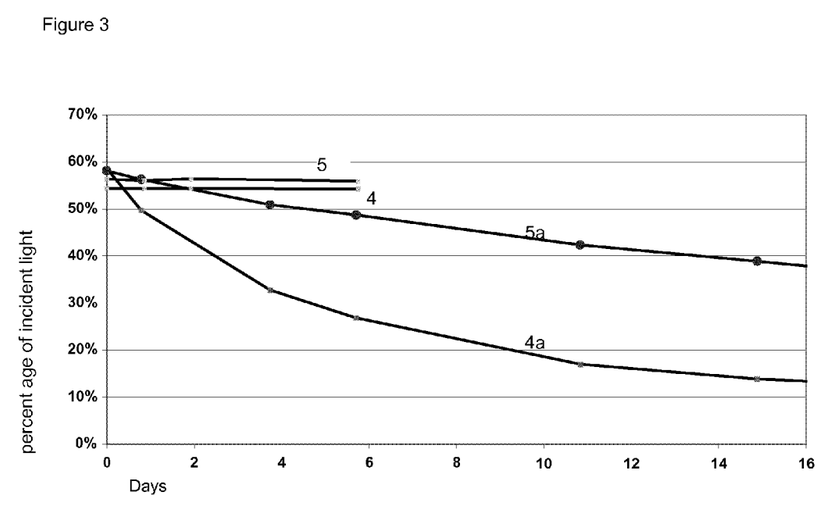

FIGS. 1 and 3 show, on the abscissa, the exposure time in days and, on the ordinate, the percentage of the incident light (450 to 455 nm) which has been absorbed.

The numbers beside the three curves correspond to the sample numbers.

It was found that the absorption of light in the case of the samples which had no barrier layer on the top and bottoms sides (samples with the suffix "a") decreased significantly with exposure time.

In the case of the inventive color converters which had a barrier layer on both the top and bottom sides (samples without suffix "a"), the absorption remained virtually constant over the exposure period with a much weaker overall decrease in absorption compared to color converters having no barrier layer on both the top and bottom sides.

Figure 2:
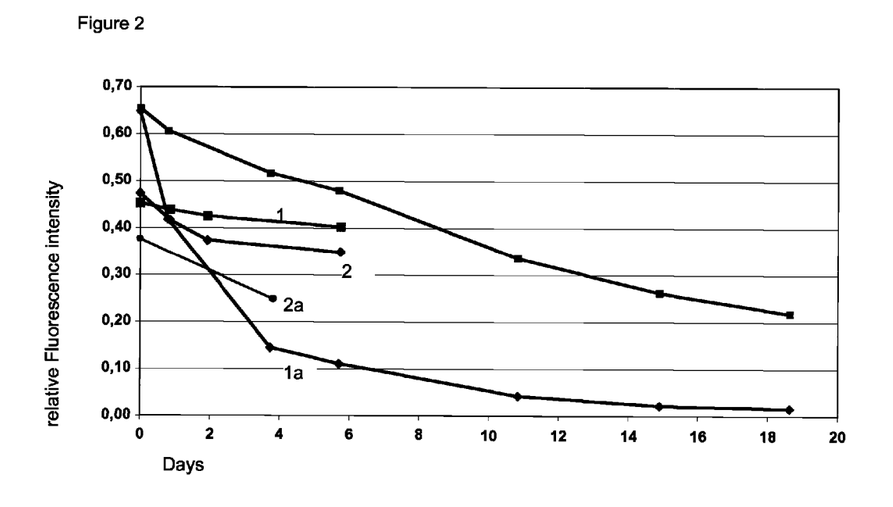
Figure 4:
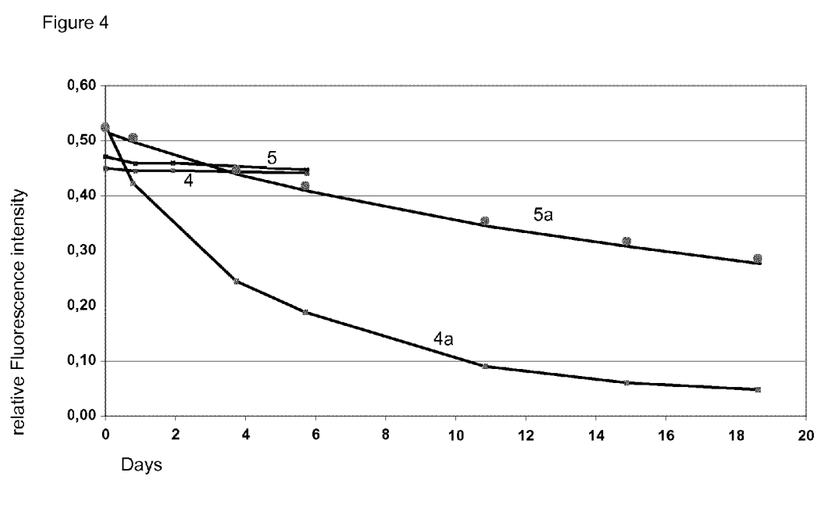

FIGS. 2 and 4 show, on the abscissa, the exposure time in days and, on the ordinate, the relative fluorescence intensity.

The numbers beside the three curves correspond to the sample numbers.

It was found that the fluorescence intensity in the case of the samples which had no barrier layer on the top and bottoms sides (samples with the suffix "a") decreased significantly with exposure time.

In the case of the inventive color converters which had a barrier layer on both the top and bottom sides (samples without suffix "a"), the fluorescence remained virtually constant over the exposure period with a much weaker overall decrease in fluorescence compared to color converters having no barrier layer on both the top and bottom sides.

Production of the Color Converter 6 and 7:

The desired amount of dye(s), polymer and TiO$_2$ (see table 1 below) were fed into a double shaft extruder of the Collin ZSK 25-30D type and processed to granules. A single shaft extruder of the Collin Teach line E 20 T was charged with these granules. The granules were processed to a film having a thickness of approx. 400 μm via slot type nozzles. Circular film pieces each with a diameter of 22 mm were punched out of this film, and then served as test samples.

TABLE 1

| No. | polymer | dye | content of dye 1* | dye | content of dye 3* | TiO$_2$ content* | film thickness |
|---|---|---|---|---|---|---|---|
| 6 | 1 | 1 | 0.008% by wt. | 3 | — | 0.50% by wt. | 400 μm |
| 7 | 1 | 1 | 0.008% by wt. | 3 | 0.0015% by wt. | 0.50% by wt. | 400 μm |

*based on the amount of polymer used

Encapsulation with Barrier Material 2
Route a)

The punched film pieces were transferred with the barrier material 2 (ESCAL™ film) into a nitrogen-filled glove-box with yellow light conditions. After about 2 hours, a photo-curable adhesive was applied to the top side of the film piece. The barrier material 2 was placed onto the adhesive side and pressed on using rollers. The adhesion was cured with UV-A light and visible light. The same procedure was repeated on the bottom side of the film piece. Finally, the top and bottom barrier materials passing over the color converter were sealed with the aid of heat sealing pliers. The thus obtained color converters had a barrier layer on both the top and bottom sides.
Route b)

The punched film pieces were transferred with the barrier material 2 (ESCAL™ film) into a nitrogen-filled glove-box. The glove-box comprised a hetseal laminator. After about 2 hours, the film pieces and the barrier material 2 (ESCAL™ L film, the PE side of the barrier material faced the film piece) were pressed together at 150° C. and sealed in the hot seal laminator. The same procedure was repeated on the bottom side of the film piece.
Production of the Color Converter 8 and 9:

Approx. 20 g of polymer and the desired amount of dye were dissolved in approx. 60 mL of methylene chloride, and 0.1% by weight of TiO$_2$, based on the amount of polymer used, was dispersed therein (see table 2). The resulting solution/dispersion was coated onto a glass surface. After the solvent had dried off, the film was detached from the glass, crushed, dried at 50° C. in a vacuum drying cabinet overnight, ground in a laboratory mill and the powder obtained was dried at 50° C. in a vacuum drying cabinet overnight. The powder was hot pressed at 200° C. at a pressure of 3 bar (for 6 minutes) and then at a pressure of 100 bar (5 min) using a metal pressing frame to give circular polymer film pieces each with a diameter of 1.5 mm.

Encapsulation with Barrier Material 2:

The encapsulation process described above using barrier material 2 was repeated but using color converter 8 and 9 instead of color converter 6 and 7.

The specimens no. 6, 6a, 7, 7a, 8, 8a, 9 and 9a were exposed with the exposure apparatus constantly over a period of 20 days as described above. Table 3 below shows the photostability and the remaining fluorescence.

TABLE 3

| No | photostability remaining fluorescence (%) after x days of exposure |
|---|---|
| 6 | after 20 days: >90% |
| 6a | after 10 days: <50% |
| 7 | after 20 days: >90% |
| 7a | after 10 days: <50% |
| 8 | after 20 days: >90% |
| 8a | after 10 days: <50% |
| 9 | after 20 days: >90% |
| 9a | after 10 days: <50% |

It was found that the fluorescence intensity in the case of the samples which had no barrier layer on the top and bottoms sides (samples with the suffix "a") decreased significantly with exposure time.

In the case of the inventive color converters which had a barrier layer both on the top and bottom sides (samples without suffix "a"), the fluorescence remained virtually constant over the exposure period with a much weaker overall decrease in fluorescence compared to color converters having no barrier layer both on the top and bottom sides.
Production of the Color Converters 10 and 11:

The encapsulation process described above for color converter 6 and 7 was repeated but using barrier material 3 instead of barrier material 2.
Production of the Color Converters 12 and 13:

The encapsulation process described above for color converter 6 and 7 was repeated but using barrier material 4 instead of barrier material 2.
Production of the Color Converters 14 and 15:

The encapsulation process described above for color converter 8 and 9 was repeated but using barrier material 3 instead of barrier material 2.

TABLE 2

| No. | polymer | dye | content of dye 1* | dye | content of dye 3* | TiO$_2$ content* | film thickness |
|---|---|---|---|---|---|---|---|
| 8 | 2 | 1 | 0.0048% by wt. | 3 | — | 0.10% by wt. | 1.5 mm |
| 9 | 2 | 1 | 0.0048% by wt. | 3 | 0.00105% by wt. | 0.10% by wt. | 1.5 mm |

*based on the amount of polymer used

Production of the Color Converters 16 and 17:

The encapsulation process described above for color converter 8 and 9 was repeated but using barrier material 4 instead of barrier material 2.

In the case of the inventive color converters 10, 11, 12, 13, 14, 15, 16 and 17 which had barrier layers both on the top and bottom sides, the fluorescence remained virtually constant over the exposure period with a much weaker overall decrease in fluorescence compared to comparison color converters having no barrier layer on both the top and bottom sides.

The invention claimed is:

1. An illumination device, comprising:
    an LED; and
    a color converter,
    wherein the color converter comprises:
    at least one layer comprising at least one organic fluorescent colorant, the at least one organic fluorescent colorant embedded into a matrix of an organic polymer which is polystyrene, polycarbonate, polymethyl methacrylate, polyvinylpyrrolidone, polymethacrylate, polyacrylate, polyvinyl acetate, polybutene or polyethylene glycol; and
    at least one barrier layer having a low permeability to oxygen of less than 100 mL/m²*d,
    wherein the at least one barrier layer is selected from the group consisting of a glass, quartz, a metal oxide, $SiO_2$, titanium nitride, a $SiO_2$/metal oxide multilayer material, polyvinyl alcohol, polyacrylonitrile, polyvinylidene chloride, a liquid-crystal polymer, polybutylene terephthalate, polyethylene terephthalate, polyvinyl butyrate, polyvinyl chloride, a polyamide, a polyoxymethylene, a polyimide, a polyetherimide, and an epoxy resin,
    wherein the at least one organic fluorescent colorant is selected from the group consisting of:

II

III

IV

V

VI

VII

VIII

IX and

X wherein
R¹ is a linear or branched $C_1$-$C_{18}$ alkyl radical, a $C_4$-$C_8$ cycloalkyl radical which is optionally mono- or polysubstituted by halogen or by a linear or branched $C_1$-$C_{18}$ alkyl, phenyl, or naphthyl, where the phenyl or naphthyl is optionally mono- or polysubstituted by halogen or by a linear or branched $C_1$-$C_{18}$ alkyl;

X represents a substituent in an ortho, para, or both ortho and para positions and is a linear or branched $C_1$-$C_{18}$ alkyl; and y is a number from 0 to 3;

wherein the at least one layer comprising the at least one organic fluorescent colorant is surrounded on all sides by the at least one barrier layer having a low permeability to oxygen;

wherein the LED and the color converter are present in a remote phosphor structure;

wherein air, noble gases, nitrogen or other gases or mixtures thereof are present between the color converter and the LED; and wherein the distance between the LED and the color converter is from 0.1 to 10 cm.

2. The illumination device according to claim 1, wherein the at least one barrier layer consists essentially of at least one barrier material having a low specific oxygen permeability of less than 1000 mL*100 μm /m²*d.

3. The illumination device according to claim 1, wherein the at least one barrier layer has a low permeability to water vapor of less than 1 g/m²*d.

4. The illumination device according to claim 1, wherein the organic fluorescent dye is at least one selected from the group consisting of 3,9-dicyanoperylene-4,10-bis(isobutyl carboxylate) and 3,10-dicyanoperylene-4,9-bis(isobutylcarboxylate).

5. The illumination device according to claim 1, wherein the color converter is a film, a plate, or a sheet.

6. A method for converting light produced by an LED, the method comprising:

passing light produced by the LED through a color converter, the color converter comprising:

at least one layer comprising at least one organic fluorescent colorant, the at least one organic fluorescent colorant embedded into a matrix of an organic polymer which is polystyrene, polycarbonate, polymethyl methacrylate, polyvinylpyrrolidone, polymethacrylate, polyacrylate, polyvinyl acetate, polybutene or polyethylene glycol; and at least one barrier layer having a low permeability to oxygen of less than 100 mL /m²*d, wherein the at least one barrier layer is selected from the group consisting of a glass, quartz, a metal oxide, SiO₂, titanium nitride, a SiO₂/metal oxide multilayer material, polyvinyl alcohol, polyacrylonitrile, polyvinylidene chloride, a liquid-crystal polymer, polybutylene terephthalate, polyethylene terephthalate, polyvinyl butyrate, polyvinyl chloride, a polyamide, a polyoxymethylene, a polyimide, a polyetherimide, and an epoxy resin, wherein the at least one organic fluorescent colorant is selected from the group consisting of:

II

III

IV

V

VI

VII

VIII

IX

X and wherein $R^1$ is a linear or branched $C_1$-$C_{18}$ alkyl radical, a $C_4$-$C_8$ cycloalkyl radical which is optionally mono- or polysubstituted by halogen or by a linear or branched $C_1$-$C_{18}$ alkyl, phenyl, or naphthyl, where the phenyl or naphthyl is optionally mono- or polysubstituted by halogen or by a linear or branched $C_1$-$C_{18}$ alkyl;

X represents a substituent in an ortho, para, or both ortho and para positions and is a linear or branched $C_1$-$C_{18}$ alkyl; and y is a number from 0 to 3;

wherein the at least one layer comprising the at least one organic fluorescent colorant is surrounded on all sides by the at least one barrier layer having a low permeability to oxygen;

wherein the LED and the color converter are present in a remote phosphor structure;

wherein air, noble gases, nitrogen or other gases or mixtures thereof are present between the color converter and the LED; and wherein the distance between the LED and the color converter is from 0.1 to 10 cm.

7. The illumination device according to claim 1, wherein the matrix material consists essentially of polystyrene and/or polycarbonate.

8. The illumination device according to claim 1, wherein the matrix material is poly(methyl methacrylate).

9. A method for protecting the lat least one layer comprising at least one organic fluorescent colorant of the illumincation device of claim 1, the method comprising: surrounding the at least one layer comprising at least one organic fluorescent colorant on all sides by the at least one barrier layer, thereby obtaining the color converter.

\* \* \* \* \*